United States Patent [19]
Nishikawa

[11] Patent Number: 5,783,972
[45] Date of Patent: Jul. 21, 1998

[54] POWER SAVING PLL CIRCUIT

[75] Inventor: Masato Nishikawa, Tokyo, Japan

[73] Assignee: NEC Corporation, Tokyo, Japan

[21] Appl. No.: 757,806

[22] Filed: Nov. 27, 1996

[30] Foreign Application Priority Data

Nov. 29, 1995 [JP] Japan ................... 7-311247

[51] Int. Cl.$^6$ .................. H03L 7/089; H03L 7/18
[52] U.S. Cl. .................. 331/17; 331/1 A; 331/8; 331/16; 331/25; 327/157; 327/159; 455/260
[58] Field of Search .................. 331/1 A, 4, 8, 331/16, 17, 18, 25; 327/156–159; 455/260

[56] References Cited

U.S. PATENT DOCUMENTS

| | | | |
|---|---|---|---|
| 4,885,552 | 12/1989 | Boudewijns | 331/17 X |
| 5,233,314 | 8/1993 | McDermott et al. | |
| 5,362,990 | 11/1994 | Alvarez et al. | |
| 5,386,437 | 1/1995 | Yasuda. | |

FOREIGN PATENT DOCUMENTS

| 685664 | 3/1994 | Japan. |
|---|---|---|
| WO95 10880 | 4/1995 | WIPO. |

OTHER PUBLICATIONS

Patent Abstracts of Japan, vol. 018, No. 340 (E–1569), 27 Jun. 1994 & JP 06 085664 A (NEC IC Microcomput Syst Ltd), 25 Mar. 1994, *abstract*.

*Primary Examiner*—David Mis

[57] ABSTRACT

A phase lock loop includes a voltage controlled oscillator (VCO), a phase comparator for comparing the phases of the output of the VCO and a reference signal, a charge pump circuit, including a plurality of current sources, for supplying a control voltage by charging or discharging a capacitor based on the outputs of the current sources, and a current source controller for controlling the current output of the current sources by a n-bit current control signal. Charge current and discharge current by the charge pump circuit are controlled in n bits so that a rapid synchronization during lock-in and a low jitter after lock-in can be obtained.

9 Claims, 8 Drawing Sheets

POWER SAVING PLL CIRCUIT

BACKGROUND OF THE INVENTION

(a) Field of the Invention

The invention relates to a PLL (phase locked loop) circuit, in particular, to a power saving PLL circuit which includes a charge pump circuit for effecting a rapid lock-in and a low jitter.

(b) Description of the Related Art

A conventional PLL circuit is known which includes a phase comparator, a VCO (voltage controlled oscillator) and a charge pump circuit etc. The PLL circuit is generally used in a portable telephone system, a pager system, a frequency synthesizer which multiplies an input frequency by n, a frequency multiplier as used in a microprocessor, for example, for generating an internal clock frequency above an external clock frequency, or in a device which adjusts the timing of an input/output signal.

FIG. 1 is a block diagram of a PLL circuit, showing an example of the prior art. In the drawing, a conventional PLL circuit 1a includes a reference frequency divider 2 which divides an external reference frequency supplied from a frequency generator (not illustrated), an internal frequency divider 7 to which a VCO output, to be described later, is input, a phase comparator 3 which receives outputs from both the frequency dividers 2 and 7 at respective inputs thereof to effect a phase comparison, a charge pump circuit 4a, responsive to a result of comparison by the phase comparator 3, to supply charge current or sink discharge current, a low-pass filter (e.g. LPF) 5 which passes low frequencies of an output from the charge pump circuit 4a, and VCO 6 which responds to an output from the filter 5 to supply a desired frequency as an output signal through an output terminal 8 and also to the internal frequency divider 7. To facilitate the understanding, the description will be given to a conventional PLL circuit 1a having a VCO in which an output frequency is proportional to a control voltage by a positive factor. However, the invention is not limited the type of the PLL circuit.

In the PLL circuit 1a, the phase comparator 3 receives at a fist input R the first output from the reference frequency divider 2, which divides the external reference frequency output from the reference frequency generator, as typified by a crystal oscillator of a temperature compensation type. The phase comparator also receives at a second input V the second output from the internal frequency divider 7, which divides the frequency of the output from the VCO 6, for effecting a phase comparison between both the input signals. When the first signal from the first input R is leading the second signal from the second input V, an inverted UP signal, (XUP, i.e., top barred UP) is delivered at an output terminal XUP. Conversely, when the first signal from the first input R is lagging from the second input V, an inverted DOWN signal (XDOWN) is delivered at its output XDOWN. When the input signals from both the inputs R and V substantially coincide with each other in phase, no output is delivered through the output XUP or XDOWN.

The charge pump circuit 4a receives XUP or XDOWN signal from the phase comparator 3. When receiving a XUP signal, the charge pump circuit 4a supplies a charge current to the LPF 5 and sinks discharge current from the filter 5 when receiving a XDOWN signal. The filter 5 functions to filter the potential change effected by the charge pump circuit 4a to supply a control voltage to the VCO 6, which outputs an output signal having a frequency depending on the control voltage supplied from the filter 5.

In this manner, the PLL circuit 1a functions to output a required frequency, using the external reference frequency supplied from the reference frequency generator.

Recently, field of application for the PLL circuit is increasing, and an increased demand is placed on the PLL circuit so as to improve its characteristics such as a reduction in lock-up time, a low jitter, a reduction in current dissipation, for example. In particular, to improve the response of the PLL circuit, it is necessary to reduce the pull-in time effected by the charge pump circuit. However, a conventional charge pump circuit generally suffers from trade-offs between a reduction in the pull-in time and a low jitter after lock-in of the PLL circuit.

There has been a proposal in the prior art for the PLL circuit to overcome the trade-offs described above. FIG. 2 shows an example of the proposal described in Patent Publication No. JP-A-1994-85,664, and is a circuit diagram of a specific arrangement of a principal part of the improved PLL circuit described therein. The PLL circuit includes a synchronization detecting section 18a in addition to the phase comparator 3, a charge pump circuit 4a, VCO 6 etc., which are similar to those in FIG. 1, and some of them are omitted in FIG. 2.

The synchronization detecting section 18a comprises a NAND gate 28, a low-pass filter including a resister R1 having an end connected to the output of the NAND gate 28 and a capacitor C2 connected between the other end of the resistor R1 and ground, and an inverter 29 having an input connected to the other end of the resistor R1.

Signals from the inputs R and V of the phase comparator 3 are compared against each other in the phase comparator 3, and output signals from the XUP output and XDOWN output are fed to the synchronization detecting section 18a. A signal corresponding to a phase error between the input signals of the phase comparator 3 is also delivered to the charge pump circuit 4a. The charge pump circuit 4a includes an inverter 14, a switching control circuit 15 which receives the output signals, partly through the inverter 14, from the phase comparator 3, a current source 17a controlled by an output from the synchronization detecting section 18a, and a current mirror section 16 which shifts or copies the current output (I1+I2) supplied from the current source section 17a into a charge current I6 or a discharge current I7 to be delivered by the switching section 15.

The switching section 15 includes switching FETs Q6 and Q7 responsive to the output from the XUP and DOWN outputs, respective, of the phase comparator 3. The current source 17a includes FETs Q2 and Q12 which determine the currents I1 and I2, and an FET Q11 operating as a switching element which controls the current I2. The FET Q11 is controlled by an output from the synchronization detecting section 18a. The current mirror section 16 includes a first current mirror including FETs Q1, Q3 and Q5, and a second current mirror including FETs Q4 and Q8. Of these transistors, FETs Q2 and Q12 are of N-channel depletion-type, FETs Q1, Q3, Q5, Q6 and Q11 are of P-channel enhancement-type, and FETs Q4, Q7 and Q8 are of N-channel enhancement-type.

When a large phase difference exists between the signals from the inputs R and V, the phase comparator 3 periodically delivers XUP or XDOWN signals having a large pulse width to charge the capacitor C2 in the synchronization detecting section 18a, whereby the input voltage VC of the inverter 29 rises. After the input voltage VC exceeds the threshold voltage of the inverter 29, the output of the inverter 29, which represents a result of the comparison in the synchronization detecting section 18a, falls to a low level.

As a consequence, the FET Q11 is turned on, to pass a large current I6 or I7, which is proportional to the current (I1+I2), through the FET Q5 or Q8 in the current mirror section 16, thereby charging or discharging the capacitor C1 connected to the output terminal 13 of the charge pump circuit 4a.

When a phase difference between the signals from the inputs R and V is small, the phase comparator 3 delivers XUP or XDOWN output less frequently, whereby the capacitor C2 in the synchronization detecting section 18a discharges, reducing the output voltage VC of the low-pass filter R1 and C2. As a consequence, the voltage VC falls to a level lower than the threshold voltage of the inverter 29, whereupon the output of the inverter 29 rises to a high level. Consequently, the FET Q11 is turned off, and a low current I6 or I7 which is proportional to the current I1 passes through the FET Q5 or Q8 in the current mirror section 16, thereby charging or discharging the capacitor C1 connected to the output terminal 13 of the charge pump circuit 4a.

In this manner, the improved PLL circuit detects a synchronized/non-synchronized state at the output of the phase comparator 3, and switches the current delivered to the charge pump circuit 4a, i.e., switches the charge/discharge current fed to the LPF 5 between two levels, thereby reducing the pull-in time by the charge pump circuit 4a while achieving a low jitter after establishing a pull-in.

Recently, systems such as a portable telephone or a pager powered by a cell or battery are increasing. In order to extend the operational duration of the cell or battery, it is requested to achieve a reduction in the power dissipation of such systems.

In the improved PLL circuit as described above, the charge or the discharge current generated by the charge pump circuit can be only switched between two levels corresponding to the synchronized or non-synchronized state at the inputs of the phase comparator. That is, the power saving function of the conventional PLL circuit is not sufficient.

SUMMARY OF THE INVENTION

It is an object of the invention to provide an improved PLL circuit having a small pull-in time effected by a charge pump circuit, a low jitter after establishment of a pull-in, and capable of reducing a current dissipation during the pull-in operation.

In accordance with the invention, there is provided a PLL circuit comprising: a voltage controlled oscillator section for receiving a first signal representing a control voltage to output a second signal having a first frequency based on the control voltage; a phase comparator for comparing a first phase of the second signal against a second phase of a reference signal having a reference frequency to output a first or second phase error signal representing a magnitude of a phase lead or phase lag of the first phase with respect to the second phase;

a current controller for receiving the first and second phase error signals to output a current control signal representing a magnitude of the phase lead or phase lag, the current control signal being represented by n bits wherein n is not lower than two; and a control voltage generating section for receiving the first and second phase error signals and current control signal to generate the first signal, the control voltage having a magnitude based on the current control signal.

In the PLL circuit of the invention, the current source controller preferably includes a synchronization detecting section which receives outputs from the phase comparator and determines whether input signals to the phase comparator are synchronized or non-synchronized, and an n-bit counter for counting pulse duration of the phase error signals based on a clock signal.

In the PLL circuit of the present invention, the control voltage generating section may include a current source section including a plurality of current sources to control the charge current or discharge current.

In the PLL circuit according to the present invention, a pull-in time is reduced, while a low jitter and a low power dissipation can be obtained.

The above and other object, features and advantages of the invention will be more apparent from the following description with reference to the accompanying drawings.

BRIEF DESCRIPTIONS OF THE DRAWINGS

DESCRIPTION OF THE PREFERRED EMBODIMENTS

Referring to the accompanying drawings, several embodiments of the invention will now be described.

Figure 3:
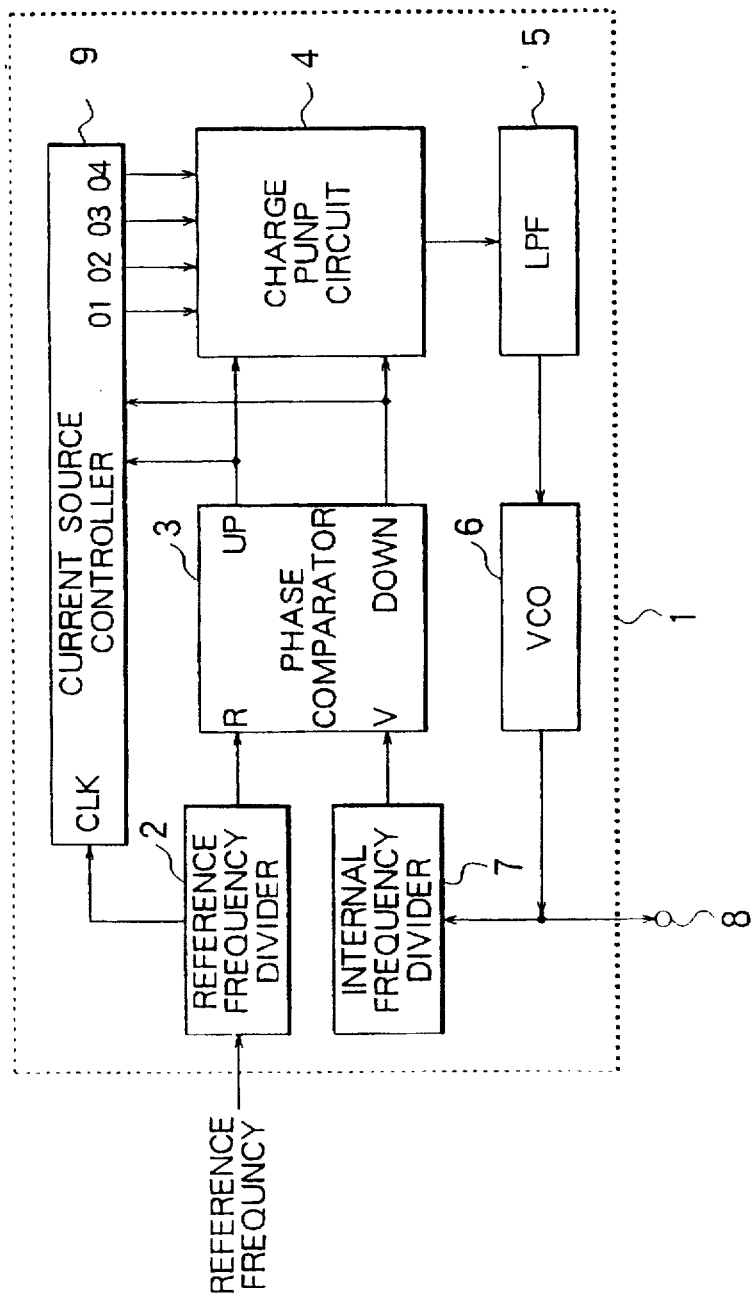
FIG. 3 is a block diagram of a PLL circuit according to an embodiment of the invention.

FIG. 3 shows a PLL circuit according to an embodiment of the invention. The PLL circuit 1 includes a reference frequency divider 2 which divides the frequency of a reference frequency signal fed from an external reference frequency generator not shown, an internal frequency divider 7 which divides the internal frequency output from a VCO 6, a phase comparator 3 for comparing the outputs from both the dividers 2 and 7 to supply UP signal, DOWN signal or no signal in accordance with a result of the comparison, a charge pump circuit 4, including a plurality of current sources, for receiving UP or DOWN signal from the phase comparator 3 to supply a charge current or sink a discharge current, a current source controller 9 for receiving UP and DOWN signals from the phase comparator 3 and a clock signal CLK from the reference frequency divider 2 to control the current output from the current sources in the charge pump circuit 4, a filter (a low-pass filter (LPF) in this embodiment) 5 for filtering an output from the charge pump circuit, and the VCO 6 responsive to an output from the LPF 5 to deliver a desired voltage through an output terminal 8 and to the internal frequency divider 7.

Figure 1:
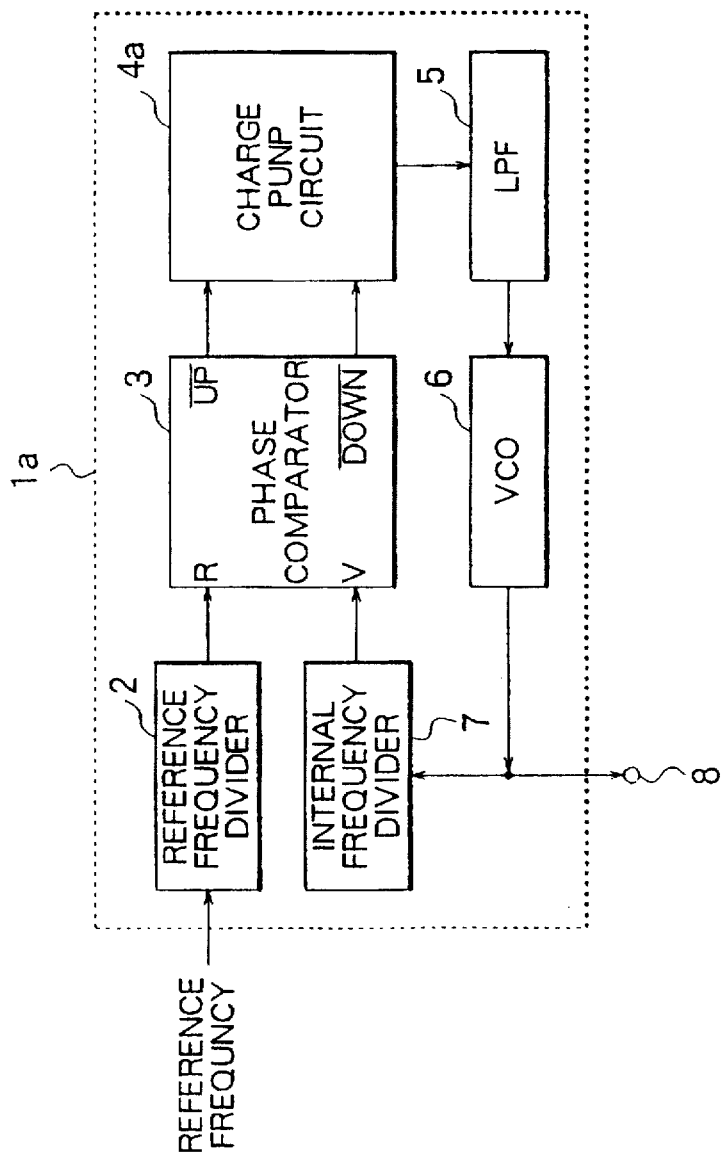
FIG. 1 is a block diagram of a conventional PLL circuit.

The charge pump circuit 4, which receives UP or DOWN signal from the phase comparator 3, is controlled by the current source controller 9 to generate a charge current for the output thereof upon receiving an UP signal and to sink a discharge current from the output thereof when receiving a DOWN signal. The filter 5 and a VCO 6 are similar to those in FIG. 1, and the details thereof will not be described here for avoiding a duplication.

In the exemplified configuration of the PLL circuit 1 in FIG. 3, an output from the reference frequency divider 2 is supplied as the clock signal to the clock input CLK of the current source controller 9. However, the source of the clock signal is not limited thereto, but any clock signal having a frequency higher than the frequency of the output of the internal frequency divider 7 may be used as well.

The PLL circuit 1 of the present embodiment has a low pull-in time, a low jitter after lock-in, and a lower power dissipation, which are obtained by changing, with the aid of the current source controller 9, the charge current or discharge current during the pull-in operation in accordance with the magnitude of the phase error between input signals R and V of the phase comparator 3.

Figure 4:
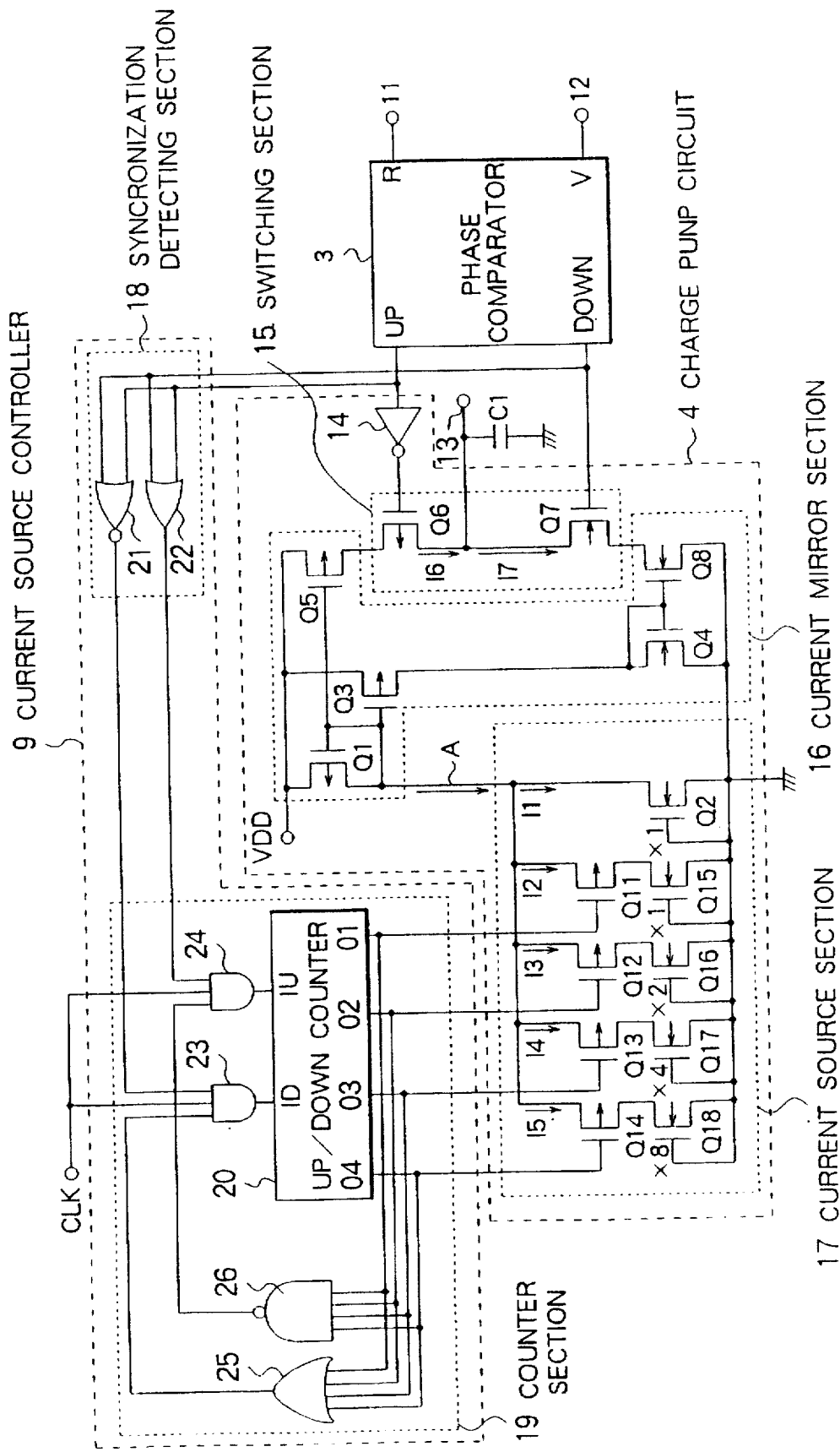
FIG. 4 is a circuit diagram of a specific arrangement of a principal part of the PLL circuit shown in FIG. 3.

FIG. 4 is a circuit diagram of an exemplified arrangement for a principal part of the PLL circuit shown in FIG. 3, showing a specific example of the charge pump circuit 4 and the current source controller 9. The current source controller 9 includes a synchronization detecting section 18 and a counter section 19. The charge pump circuit 4 includes an inverter 14, a switching section 15, a current mirror section 16 and a current source section 17.

The phase comparator 3 receives through terminal 11 and 12 signals R and V from the dividers 2 and 7, respectively, and compares the phases of both the inputs R and V against each other to supply an UP signal or DOWN signal depending on the phase difference between the inputs R and V. The synchronization detecting section 18 of the current source controller 9 receives UP or DOWN signal from the phase comparator 3 to determine whether or not the PLL circuit is in a synchronized state. The counter section 19 receives the output from the synchronization detecting section 18 and a clock signal from the frequency divider 2 to supply a 4-bit output signal representing the count therein to the current source section 17 through terminals 01 to 04 of the up/down counter 20.

The switching section 15 of the charge pump circuit 4 receives the UP signal after inversion by the inverter 14 from the phase comparator 3 and a DOWN signal from the phase comparator 3 to effect switching between a charge mode and a discharge mode of the capacitor C1. The current source section 17 supplies a base (or constant) current I1 and signal currents I2 to I5 which are weighted in accordance with the 4-bit signal supplied from the current source controller 9. The current mirror section 16 shifts or copies the output current flowing through the node "A" and supplied from the current source section 17 into a charge current I6 or a discharge current I7 gated by the switching section 15.

The output from the charge pump circuit 4 functions to charge or discharge the capacitor C1 based on the current supplied from the current source section 17, which is controlled by the current source controller 9. The output from the charge pump circuit 4 is delivered through the output terminal 13 to the filter 5 shown in FIG. 3. By this configuration, it is possible to minimize the current dissipation in addition to balancing a rapid pull-in of the charge pump circuit 4 and a low jitter.

The circuit configurations of the current source controller 9 and the charge pump circuit 4 will be more specifically described below.

The synchronization detecting section 18 of the current source controller 9 includes a NOR gate 21 and an OR gate 22 each having two inputs receiving UP and DOWN outputs from the phase comparator 3. The counter section 19 of the current source controller 9 includes a pair of three-input AND gates 23 and 24 receiving outputs from the NOR gate 21 and OR gate 22, respectively. The AND gate 23 and 24 further receive a clock signal and respective feed-back signals. The counter section 19 further includes an up/down counter 20 for receiving an up-counting input IU supplied from the AND gate 24 and a down-counting input ID supplied from the AND gate 23, to supply a count output of a 4-bit binary data to the charge pump circuit 4. The feed-back loops of the counter section 19 are formed by a 4-input OR gate 25 and a 4-input NAND gate 26 which form an OR sum and a NAND product, respectively, of the 4-bit binary outputs from the up/down counter 20 and which supply the feed-back input to the AND gate 23 and 24, respectively. This configuration enables the output to change in a continuous manner.

The current source section 17 of the charge pump circuit 4 includes FET Q2 and FETs Q15 to Q18, each of which is an N-channel depletion-type MOS FET having gate and source grounded, and FETs Q11 to Q14 each formed by a P-channel enhancement-type MOS FET having source connected in common to an output node "A" of the current source section 17. The drains of the FETs Q11 to Q14 are connected to the drains of the transistors Q15 to Q18, respectively, while outputs 01 to 04 of the up/down counter 20 of the counter section 19 are supplied to the respective gates of the transistors Q11 to Q14. The drain of the transistor Q2 is also connected to the output node "A" of the current source section 17. The transistors Q2, Q15 to Q18 are sized in the ratio of 1:1:2:4:8 in order to weight current values I1 to I5.

Figure 2:
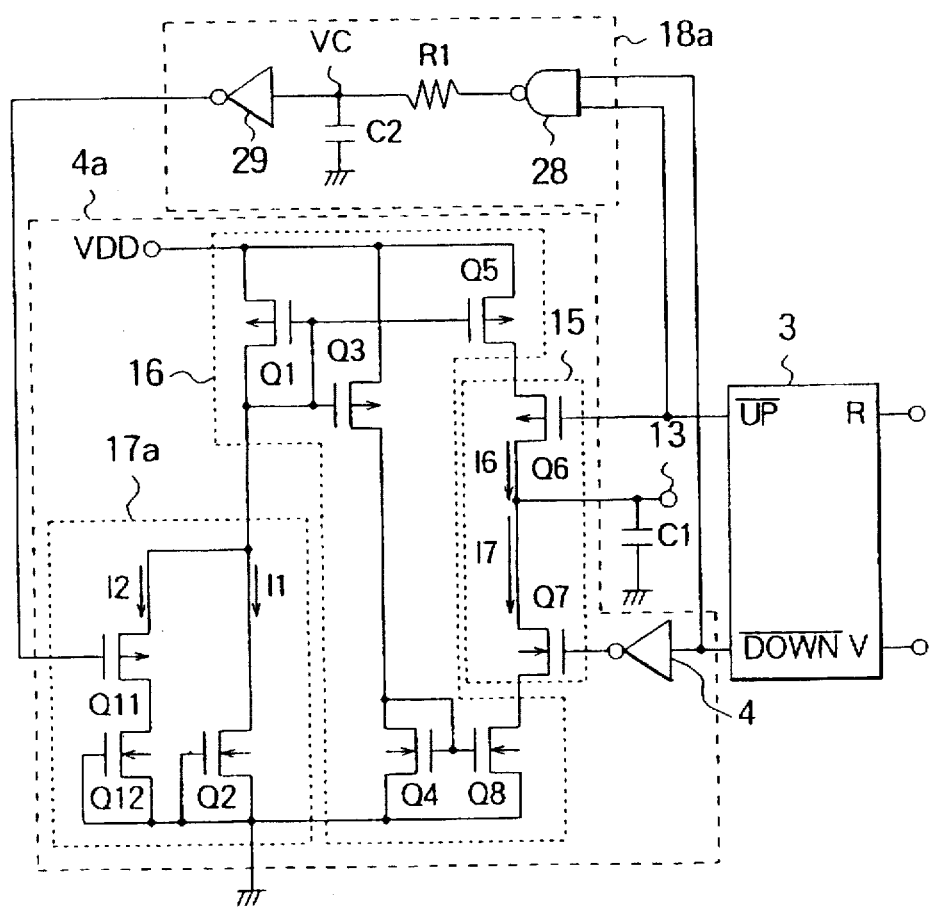
FIG. 2 is a circuit diagram of a specific arrangement of a principal part of an improved conventional PLL circuit.

The current mirror section 16 and the switching section 15 of the charge pump circuit 4 are arranged in a manner similar to those shown in FIG. 2, and the details thereof will not be described here.

The operation of the current source controller 9 and the charge pump circuit 4 are as follows. The NOR gate 21 and OR gate 22 in the synchronization detecting section 18 determine whether or not a synchronization is established based on the UP and DOWN signals delivered from the phase comparator 3. Outputs from the NOR and OR gates 21 and 22 are supplied through AND gates 23 and 24 to the up/down counter 20 together with the external clock signal having a higher frequency than the input signals supplied to the phase comparator 3.

The up/down counter 20 counts-up or counts-down based on the outputs of the AND gates 23 and 24, thereby supplying count output thereof to control the FETs Q11 to Q14 in the current source section 17. Specifically, each bit of the counter output turns on or off the FETs Q11 to Q14 to generate a total current output "A" ranging from I1 to 16×I1 where I1 represents the magnitude of the base current.

The current output "A" (A=I1+I2+I3+I4+I5) is shifted or copied by the current mirror section 16 into a charge current I6 or a discharge current I7 of the switching section 15, to charge or discharge the capacitor C1 connected to the output terminal 13. In the current source controller 9, the detection of a borrow from the output of the counter 20 is made by OR gate 25 while the detection of a carry is made by NAND gate 26. The purpose of detection of the borrow or carry is to prevent a sudden change in the output of the up/down counter 20.

Specifically, the borrow and carry outputs of the AND gates 25 and 26 are fed back to the AND gates 23 and 24, respectively, which prevent the count output from changing from 16 to 0 and changing from 0 to 16, respectively, thereby avoiding a sudden change in the current output "A" of the current source section 17 such as from I1 to 16×I1 or from 16×I1 to I1.

Figure 5:
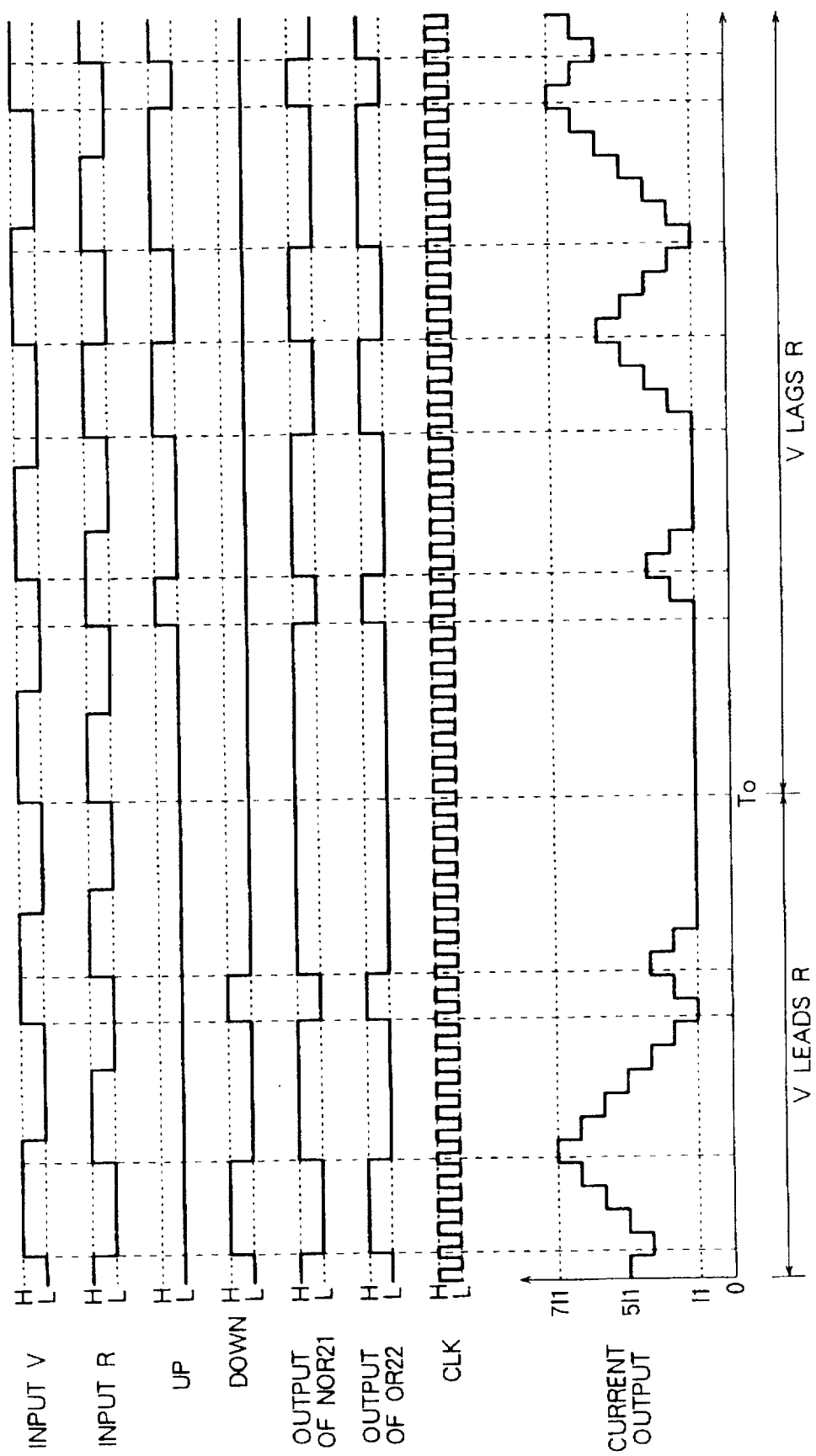
FIG. 5 is a series of timing charts, illustrating signals appearing in FIG. 4.

FIG. 5 shows a series of timing charts for signals appearing in FIG. 4. In this example, input V leads from input R in phase before time instant T0, and lags from input R in phase after time instant T0. When it is detected that the phase of the input signal V leads the phase of the input signal R in the phase comparator 3, a high level signal is output at DOWN output thereof, the high level signal having a pulse width depending on the magnitude of the phase error between the phases of the inputs R and V. Conversely, when it is detected that the phase of the input signal V lags the phase of the input signal R, a high level signal is output at UP output thereof, the high level signal having a pulse width depending on the magnitude of the phase error. In either case, a low level signal is supplied from NOR gate 21 having a pulse width which depends on the magnitude of the phase error while a high level signal is simultaneously supplied from OR gate 22. The pulse width of the output signal from OR gate 22 is converted into a number of up-count signals which corresponds to the pulse width of the output of AND gate 24 to which the clock signal CLK is applied, and the up-count signal is supplied to a corresponding input IU of the up/down counter 20. In response to the input of the up-count signal IU, the up/down counter 20 increments its count. As a consequence, the current output from the current source section 17 increases in the manner of I1 to 2×I1 to 3×I1 . . . to 16×I1 under the control of the count output from the up/down counter 20.

When the phase comparator 3 supplies a low level signal from both UP and DOWN outputs after it has supplied a high level signal from UP or DOWN output thereof which has a pulse width corresponding to the phase error, a high level signal is supplied from NOR gate 21 while a low level signal is supplied from OR gate 22. The pulse width supplied from NOR gate 21 is converted in the AND gate 23, which responds to the clock signal CLK, into a number of down-count signal which depends on the pulse width, so that the up/down counter 20 decrements its count. Consequently, the current output of the current source section 17 is reduced in the manner of 16×I1 to 15×I1 to 14×I1 . . . to I1 under the control of the count output from the up/down counter 20. The current output of the current source section 17 controlled in this manner is shifted or copied by the current mirror circuit 16 into the charge current I6 or discharge current I7 for the capacitor C1.

The above description applies generally for any phase error. However, specific description of the cases in which the phase error is extremely large and small will be described below with reference to FIGS. 6 and 7, respectively.

Figure 6:
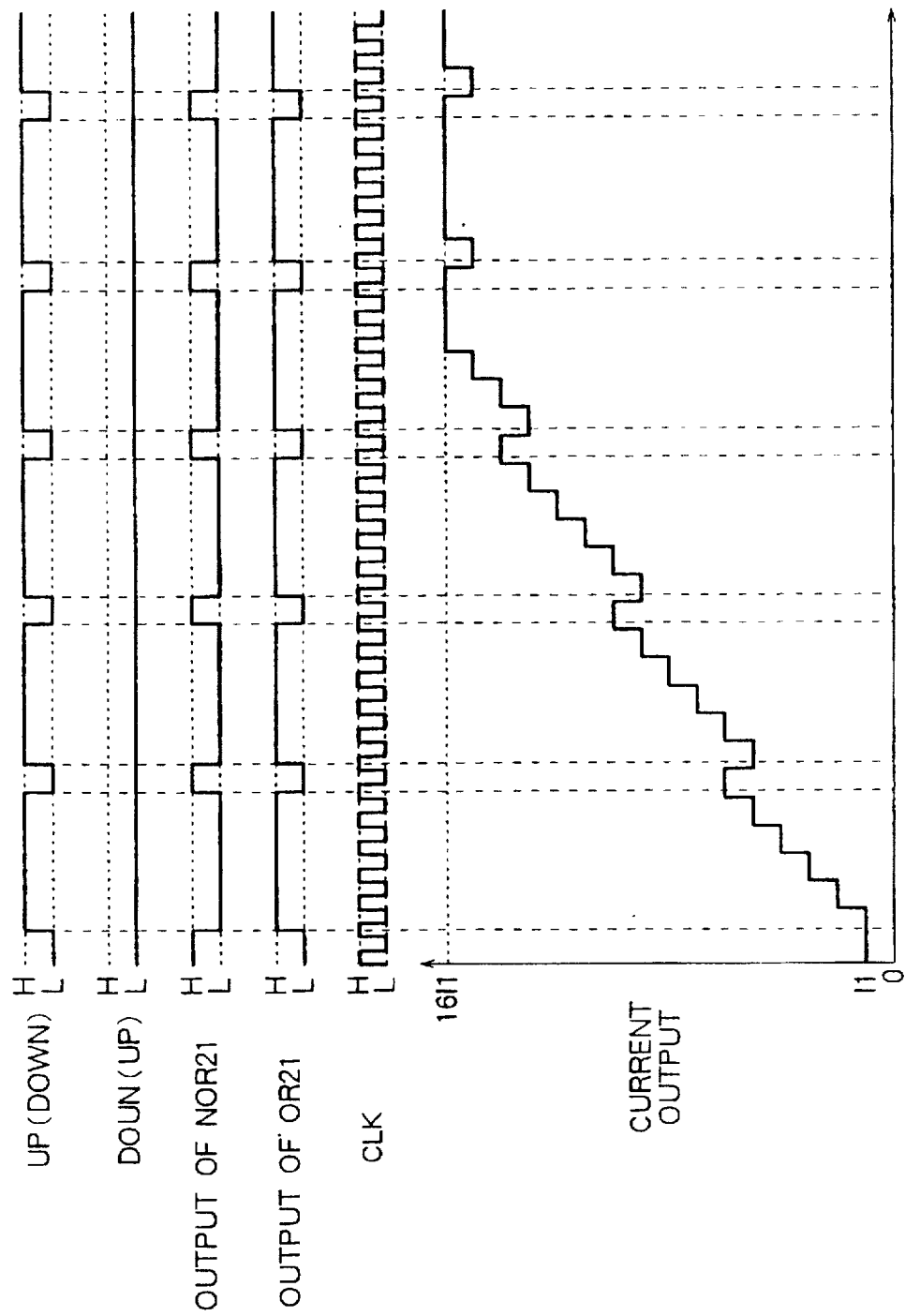
FIG. 6 is a series of timing charts, illustrating some of signals in FIG. 5 when the inputs of the phase comparator shown in FIG. 3 has a large phase error.

In FIG. 6 showing an initial phase of the PLL circuit during synchronizing operation in which the phase error between the inputs of the phase comparator 3 is large, a high level signal having a large pulse width is periodically supplied from UP (or DOWN) output of the phase comparator 3. In this case, a high level signal having a small pulse width is periodically fed from NOR gate 21 of the synchronization detecting section 18 between the intervals of high level signals having a large pulse width supplied from OR gate 22, as shown in the drawing. Accordingly, a large number of up-count signals, which exceeds in number the down-count signal supplied from AND gate 23, is fed from AND gate 24 to the up/down counter 20, with the consequence that the current output of the current source section 17 increases from I1 to 2×I1 to 3×I1 . . . until a maximum current of 16×I1 is reached. Consequently, the current mirror section 16 renders the switching section 15 to charge or discharge the capacitor C1 with a large magnitude of the current in the initial phase.

Figure 7:
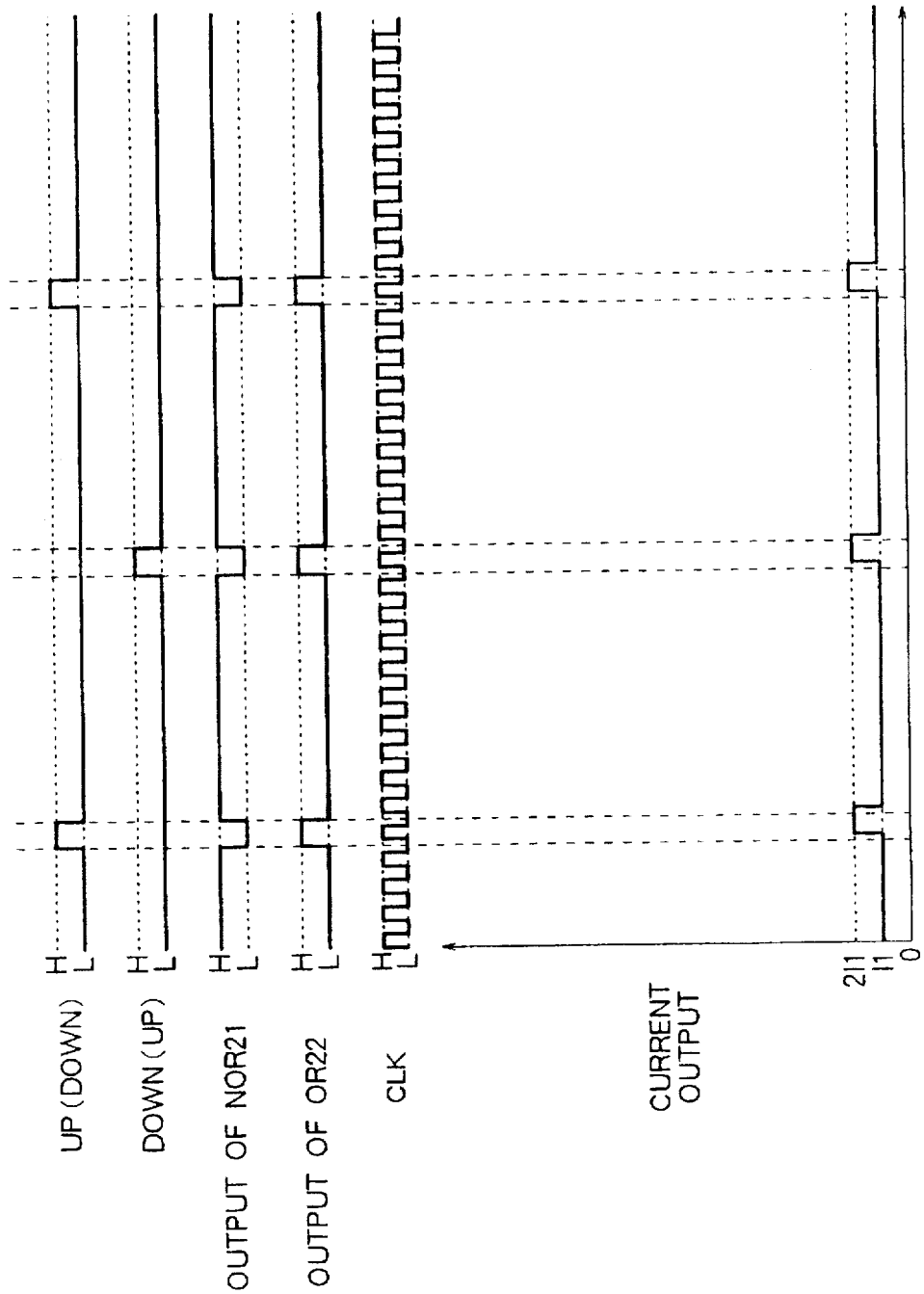
FIG. 7 is a series of timing charts, illustrating some of signals in FIG. 5 when the inputs of the phase comparator shown in FIG. 3 has a small phase error.

In FIG. 7 showing a final phase of the PLL circuit during synchronizing operation or after lock-in in which the phase error between the two inputs is small, a high level signal having a small pulse width is supplied from UP (or DOWN) output of the phase comparator 3. In this case, a high level signal having a large pulse width is periodically supplied from NOR gate 21 between high level signals having a small pulse width supplied from OR gate 22. Hence, a large number of down-count signals, which exceeds in number the up-count signals supplied from the AND gate 24, is fed to the up/down counter 20 from the AND gate 23. As a consequence, the current output of the current source section 17 only periodically increases the current output from I1 to 2I1 and immediately decreases from I2 to I1, which is a minimum current in the circuit design of FIG. 3. Consequently, the current mirror section 16 renders the switching section 15 to charge or discharge the capacitor C1 with the minimum current in the final phase.

It is to be understood that the number of bits in the up/down counter 20 or the manner of weighting each bit for the current source can be arbitrarily selected depending on a particular design for the PLL circuit.

Figure 8:
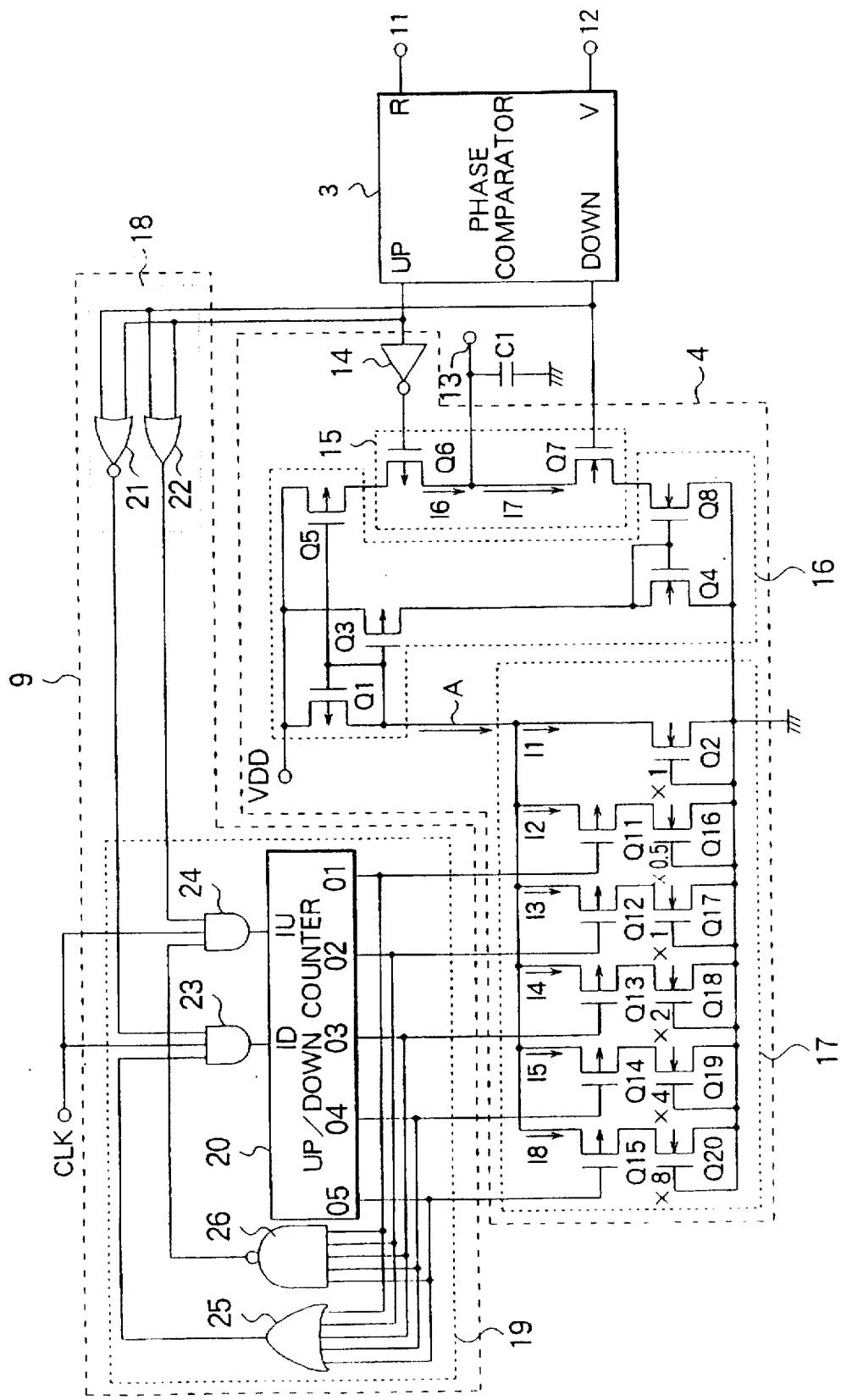
FIG. 8 is a circuit diagram of a specific arrangement of a principal part of a PLL circuit according to another embodiment of the invention.

For example, FIG. 8 shows, similarly to FIG. 3, a circuit diagram of a specific arrangement a PLL circuit according to another embodiment of the invention. The present embodiment is different from the first embodiment in that the up/down counter 20 has a five-bits output and that current in FETs Q2, and Q16 to Q20 in the current source section 17 is weighted by factors of 1, 0.5, 1, 2, 4, and 8, respectively. In this manner, the control of the current output can be incremented or decremented by a step of 0.5×I1 which is less than the magnitude of the base current I1. This further reduces jitter during a time interval in the vicinity of lock-up or after synchronization.

In the above embodiments, the MOS FETs of depletion type in the current source section 17 are exemplified. However, they may be replaced by MOS FETs of enhancement type having their gates connected to their drains.

Since the above embodiments are only illustrative, the present invention is not limited to the specific embodiments thereof and it will be apparent from those skilled in the art that various alterations or modifications can be easily made therefrom without departing from the scope of the invention.

What is claimed is:

1. A phase lock loop comprising:
   a voltage controlled oscillator section for receiving a first signal representing a control voltage to output a second signal having a first frequency based on the control voltage;
   a phase comparator for comparing a first phase of the second signal against a second phase of a reference signal having a reference frequency to output a first or second phase error signal representing a magnitude of a phase lead or phase lag of the first phase with respect to the second phase;
   a current controller for receiving the first and second phase error signals to output a current control signal representing a magnitude of the phase lead or phase lag, the current control signal being represented by n bits wherein n is not lower than two; and
   a control voltage generating section for receiving the first and second phase error signals and current control signal to generate the first signal based on the current control signal.

2. A phase lock loop as defined in claim 1 wherein each of said first and second phase error signals has a pulse duration based on the phase lead or phase lag, and wherein said current source controller includes a synchronization detecting section for detecting a synchronization between the inputs of the phase comparator based on the phase error signals, and a counter section for counting the pulse duration of the phase error signals.

3. A phase lock loop as defined in claim 2 wherein said counter section receives a clock signal for counting the pulse duration of the phase error signal.

4. A phase lock loop as defined in claim 2 wherein the clock signal is generated based on the reference signal.

5. A phase lock loop as defined in claim 1 wherein said control voltage generating section has a current source section including a plurality of current sources each controlled by one of the bits of the current control signal, and a summing section for adding outputs of said current sources.

6. A phase lock loop as defined in claim 5 wherein said plurality of current sources supply currents each weighted by $2^n$ of a unit current.

7. A phase lock loop as defined in claim 6 wherein said unit current is equal to a base current which is a minimum output of the current source section.

8. A phase lock loop as defined in claim 1 wherein said voltage controlled oscillator section includes a voltage controlled oscillator and a internal frequency divider connected to the output of the voltage controlled oscillator.

9. A phase lock loop as defined in claim 1 wherein the control voltage has a differential substantially proportional to the current control signal.

* * * * *